United States Patent
Su et al.

(10) Patent No.: US 9,105,347 B2
(45) Date of Patent: Aug. 11, 2015

(54) SHIFT REGISTER AND DRIVING METHOD THEREOF

(75) Inventors: Kuo-Chang Su, Hsin-Chu (TW);
Yung-Chih Chen, Hsin-Chu (TW);
Kuo-Hua Hsu, Hsin-Chu (TW)

(73) Assignee: AU OPTRONICS CORP., Hsinchu (TW)

( * ) Notice: Subject to any disclaimer, the term of this patent is extended or adjusted under 35 U.S.C. 154(b) by 418 days.

(21) Appl. No.: 13/270,333

(22) Filed: Oct. 11, 2011

(65) Prior Publication Data

US 2012/0169581 A1 Jul. 5, 2012

(30) Foreign Application Priority Data

Dec. 29, 2010 (TW) ................................ 99146675 A

(51) Int. Cl.
*G11C 19/28* (2006.01)

(52) U.S. Cl.
CPC ........ *G11C 19/28* (2013.01); *G09G 2310/0267* (2013.01); *G09G 2310/0286* (2013.01); *G11C 19/285* (2013.01)

(58) Field of Classification Search
CPC ................. G11C 19/28; G11C 19/285; G09G 2310/0267; G09G 2310/0286
USPC ...................... 345/100; 377/64, 79
See application file for complete search history.

(56) References Cited

U.S. PATENT DOCUMENTS

| 7,436,923 | B2 | 10/2008 | Tobita | |
|---|---|---|---|---|
| 7,688,934 | B2 | 3/2010 | Tsai et al. | |
| 8,031,827 | B2 * | 10/2011 | Tsai et al. | 377/79 |
| 2004/0046729 | A1 | 3/2004 | Moon | |
| 2007/0086558 | A1 | 4/2007 | Wei et al. | |
| 2007/0274433 | A1 | 11/2007 | Tobita | |
| 2008/0002803 | A1 * | 1/2008 | Kim et al. | 377/64 |
| 2009/0304138 | A1 * | 12/2009 | Tsai et al. | 377/79 |
| 2010/0111245 | A1 | 5/2010 | Tobita | |
| 2010/0134234 | A1 | 6/2010 | Liao et al. | |

FOREIGN PATENT DOCUMENTS

| CN | 1862650 | 11/2006 |
|---|---|---|
| CN | 101425340 | 5/2009 |
| CN | 101510443 | 8/2009 |
| CN | 101615431 | 12/2009 |
| JP | 2010135050 | 6/2010 |

* cited by examiner

*Primary Examiner* — Allison Johnson
(74) *Attorney, Agent, or Firm* — WPAT, PC; Justin King

(57) ABSTRACT

A shift register includes a signal input unit for receiving and providing an input signal, a signal output unit for controlling whether outputting a clock signal according to the input signal provided by the signal input unit, and a plurality of stable modules. Each of the stable modules is electrically coupled to an output terminal of the signal input unit, an output terminal of the signal output unit, and a default potential. Each of the stable modules receives a corresponding operation signal and is enabled in a duty of the corresponding operation signal, such that both the output terminal of the signal input unit and the output terminal of the signal output unit are electrically coupled to the default potential when the input signal is disabled. Before one of the stable modules is disabled, another of the stable modules has already been enabled.

18 Claims, 3 Drawing Sheets

SHIFT REGISTER AND DRIVING METHOD THEREOF

TECHNICAL FIELD

The disclosure relates to shift register circuits, and more particularly to a shift register using a plurality of electronic connections to stabilize signal levels at predetermined times and a driving method thereof.

BACKGROUND

A shift register circuit for flat panel displays (e.g., liquid crystal displays, LCD) generally includes a plurality of shift registers electrically coupled together by means of cascading. These shift registers orderly generate a plurality of gate driving pulse signals for driving gate wires of LCD.

Each class of these shift registers generally includes two complementary stable modules for stabilizing signals output by a signal input unit and a signal output unit of the shift register circuit. Each of the two stable modules receives a corresponding operation signal and is enabled in a duty of the corresponding operation signal, and thus the stable module is controlled to work. Generally, the operations pulses of the two stable modules are set to be complementary. That is, when the operation signal of one of the two stable modules changes from a logic high level thereof to a logic low level thereof, the operation signal of the other of the two stable modules changes from a logic low level thereof to a logic high level thereof. Thus, when one of the two stable modules works, the other of the two stable modules does not work; and when the not working stable module begins to work, the working stable module stops working. The two stable modules alternately work to stabilize signals output by the signal input unit and the signal output unit.

However, since signal delays and Thin Film Transistor (TFT) charging time delays may be generated in the shift register circuit, when an operation signal of either one of the two stable modules changes from the logic low level thereof to the logic high level thereof, a TFT of the stable module that is used to perform potential pull-down and stabilizing operations may not be immediately switched on. That is, when one of the two stable modules stops working, the other of the two stable modules may not immediately begin to work. On the contrary, when the two stable modules are switched, a time during which both the two stable modules do not work may occur. Thus, stability of the shift register circuit may be adversely affected.

SUMMARY

One embodiment in the disclosure provides a shift register that includes a signal input unit, a signal output unit, and a plurality of stable modules. The signal input unit receives and provides an input signal, and the signal output unit controls whether outputting a clock signal according to the input signal provided by the signal input unit. Each of the stable modules is electrically coupled to an output terminal of the signal input unit, an output terminal of the signal output unit, and a default potential. Each of the stable modules receives a corresponding operation signal and is enabled in a duty of the corresponding operation signal, such that both the output terminal of the signal input unit and the output terminal of the signal output unit are electrically coupled to the default potential when the input signal is disabled. Before one of the stable modules is disabled, another of the stable modules has already been enabled.

Another embodiment in the disclosure further provides a shift register driving method for controlling a potential provided by an output terminal of a shift register. The shifter register includes a signal output unit and a plurality of stable modules. The signal output unit controls whether outputting a clock signal from the output terminal of the shift register according to an input signal. Each of the stable modules is electrically coupled to the output terminal of the shift register and a default potential. The shift register driving method comprises: providing a first operation signal to a first stable module, when the first operation signal is enabled, the first operation signal enabling the output terminal of the shift register to be electrically coupled to the default potential through the first stable module when the input signal is disabled; and providing a second operation signal to a second stable module, when the second operation signal is enabled, the second operation signal enabling the output terminal of the shift register to be electrically coupled to the default potential through the second stable module when the input signal is disabled. The second operation signal is enabled before the first operation signal is disabled, and the second operation signal is disabled after the first operation signal is enabled.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
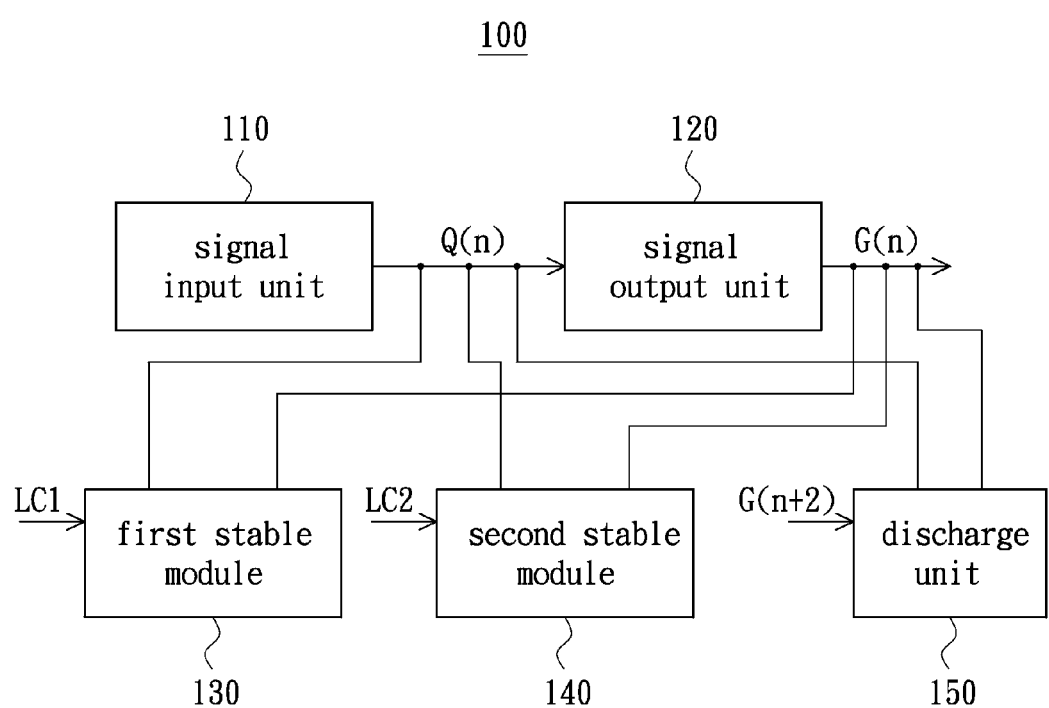
FIG. 1 is a block diagram of a shift register according to an exemplary embodiment.
Figure 2:
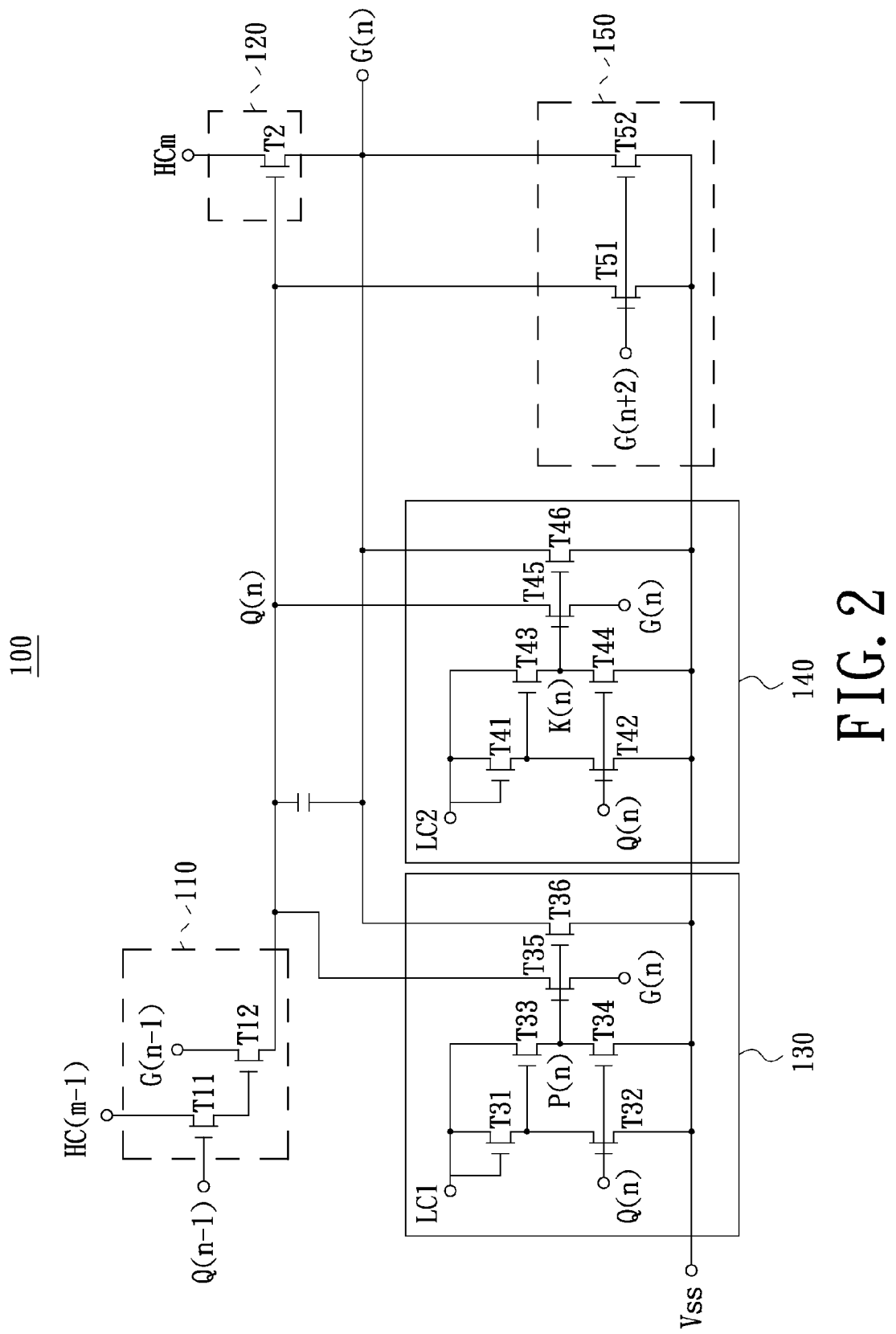
FIG. 2 is a circuit diagram of the shift register shown in FIG. 1.

Referring to FIG. 1 and FIG. 2, wherein FIG. 1 is a block diagram of a shift register 100, according to an exemplary embodiment, and FIG. 2 is a circuit diagram of the shift register 100 shown in FIG. 1. As shown in FIGS. 1-2, the shift register 100 includes a signal input unit 110, a signal output unit 120, a first stable module 130, a second stable module 140, and a discharge unit 150.

The signal input unit 110 is used to generate an input signal Q(n). The signal input unit 110 is electrically coupled to the signal output unit 120, and thus the signal output unit 120 can generate a first clock signal G(n) according to the input signal Q(n) generated by the signal input unit 110. Particularly, the signal input unit 110 includes two transistors T11, T12. The gate of the transistor T11 is electrically coupled to a previous input signal Q(n−1) generated by a signal input unit of a shift register (not shown) of a previous class. One of the source terminal and the drain terminal of the transistor T11 is electrically coupled to a previous pulse reference signal HC(m−1), and the other is electrically coupled to the gate of the transistor T12. One of the source terminal and the drain terminal of the transistor T12 is electrically coupled to the a previous first clock signal G(n−1) generated by the signal input unit of the shift register of the previous class, and the other is used as an output terminal of the signal input unit 110 to output the input signal Q(n) generated by the signal input unit 110. The signal output unit 120 includes a transistor T2. The gate of the transistor T2 is electrically coupled to the output terminal of the signal input unit 110, one of the source terminal and the drain terminal of the transistor T2 is electrically coupled to a corresponding pulse reference signal HC(m) thereof, and the other is used as an output terminal of the signal output unit 120 to output the first clock signal G(n) correspondingly generated by the signal output unit 120.

Both the first stable module 130 and the second stable module 140 are electrically coupled to the output terminal of the signal input unit 110, the signal output unit 120, and a default potential VSS. The default potential VSS can be set to be a logic low level. The first stable module 130 and the second stable module 140 respectively receives their corresponding first operation signal LC1 and second operation signal LC2 such that the first stable module 130 and the second stable module 140 is respectively enabled during working periods of the first operation signal LC1 and second operation signal LC2. Thus, when the input signal Q(n) generated by the signal input unit 110 is disabled, the output terminal of the signal input unit 110 and the output terminal of the signal output unit 120 are electrically coupled to the default potential VSS while the signal output unit 110 or 120 being correspondingly enabled by the first operation signal LC1 or second operation signal LC2. That is, the first stable module 130 and the second stable module 140 can be respectively used as pull-down circuits of the shift register circuit 100. When the first stable module 130 and the second stable module 140 work (being enabled), they respectively pull potentials of the input signal Q(n) generated by the signal input unit 110 and the first clock signal G(n) generated by the signal output unit 120 down to the default potential VSS (i.e., the logic low level).

In the present invention, circuits of the first stable module 130 and the second stable module 140 are substantially similar to each other. A main difference between the first stable module 130 and the second stable module 140 is that the first stable module 130 receives the first operation signal LC1, and the second stable module 140 receives the second operation signal LC2.

Particularly, the first stable module 130 includes transistors T31, T32, T33, T34, T35, and T36. The gate of the transistor T31 is electrically coupled to the first operation signal LC1, one of the source terminal and the drain terminal of the transistor T31 is also electrically coupled to the first operation signal LC1, and the other is electrically coupled to one of the source terminal and the drain terminal of the transistor T32. The gate of the transistor T32 receives the input signal Q(n) generated by the signal input unit 110, and the other of the source terminal and the drain terminal of the transistor T32 is electrically coupled to the default potential VSS. The gate of the transistor T33 is electrically coupled to an electric connection point between the one of the source terminal and the drain terminal of the transistor T31 and the one of source terminal and the drain terminal of the transistor T32 that are electrically coupled to each other. One of the source terminal and the drain terminal of the transistor T33 is electrically coupled to the first operation signal LC1, and the other is electrically coupled to one of the source terminal and the drain terminal of the transistor T34. The gate of the transistor T34 also receives the input signal Q(n) generated by the signal input unit 110, and the other of the source terminal and the drain terminal of the transistor T34 is electrically coupled to the default potential VSS. Both the gates of the transistors T35, T36 are electrically coupled to an electric connection point P(n) between the one of the source terminal and the drain terminal of the transistor T33 and the one of source terminal and the drain terminal of the transistor T34 that are electrically coupled to each other. One of the source terminal and the drain terminal of the transistor T35 is electrically coupled to the output terminal of the signal input unit 110, and the other receives the first clock signal G(n) generated by the signal output unit 120. One of the source terminal and the drain terminal of the transistor T36 is electrically coupled to the output terminal of the signal output unit 120, and the other is electrically coupled to the default potential VSS.

The second stable module 140 includes transistors T41, T42, T43, T44, T45, and T46. The gate of the transistor T31 is electrically coupled to the second operation signal LC2, one of the source terminal and the drain terminal of the transistor T41 is also electrically coupled to the second operation signal LC2, and the other is electrically coupled to one of the source terminal and the drain terminal of the transistor T42. The gate of the transistor T42 receives the input signal Q(n) generated by the signal input unit 110, and the other of the source terminal and the drain terminal of the transistor T42 is electrically coupled to the default potential VSS. The gate of the transistor T43 is electrically coupled to an electric connection point between the one of the source terminal and the drain terminal of the transistor T41 and the one of source terminal and the drain terminal of the transistor T42 that are electrically coupled to each other. One of the source terminal and the drain terminal of the transistor T43 is electrically coupled to the second operation signal LC2, and the other is electrically coupled to one of the source terminal and the drain terminal of the transistor T44. The gate of the transistor T44 also receives the input signal Q(n) generated by the signal input unit 110, and the other of the source terminal and the drain terminal of the transistor T44 is electrically coupled to the default potential VSS. Both the gates of the transistors T45, T46 are electrically coupled to an electric connection point K(n) between the one of the source terminal and the drain terminal of the transistor T43 and the one of source terminal and the drain terminal of the transistor T44 that are electrically coupled to each other. One of the source terminal and the drain terminal of the transistor T45 is electrically coupled to the output terminal of the signal input unit 110, and the other receives the first clock signal G(n) generated by the signal output unit 120. One of the source terminal and the drain terminal of the transistor T46 is electrically coupled to the output terminal of the signal output unit 120, and the other is electrically coupled to the default potential VSS.

The discharge unit 150 is electrically coupled to the output terminal of the signal input unit 110, the output terminal of the signal output unit 120, and the default potential VSS, and thus determines if it needs to discharge to the input signal Q(n) generated by the signal input unit 110 and the first clock signal G(n) generated by the signal output unit 120 according to control signals. Particularly, the discharge unit 150 includes two transistors T51, T52. Both the gates of the transistors T51, T52 are electrically coupled to control signals, for example, a first clock signal G(n+2) generated by a signal input unit of a shift register (not shown) of a second following class. One of the source terminal and the drain terminal of the transistor T51 is electrically coupled to the output terminal of the signal input unit 110, and the other is electrically coupled to the default potential VSS. One of the source terminal and the drain terminal of the transistor T52 is electrically coupled to the output terminal of the signal output unit 120, and the other is electrically coupled to the default potential VSS.

Figure 3:
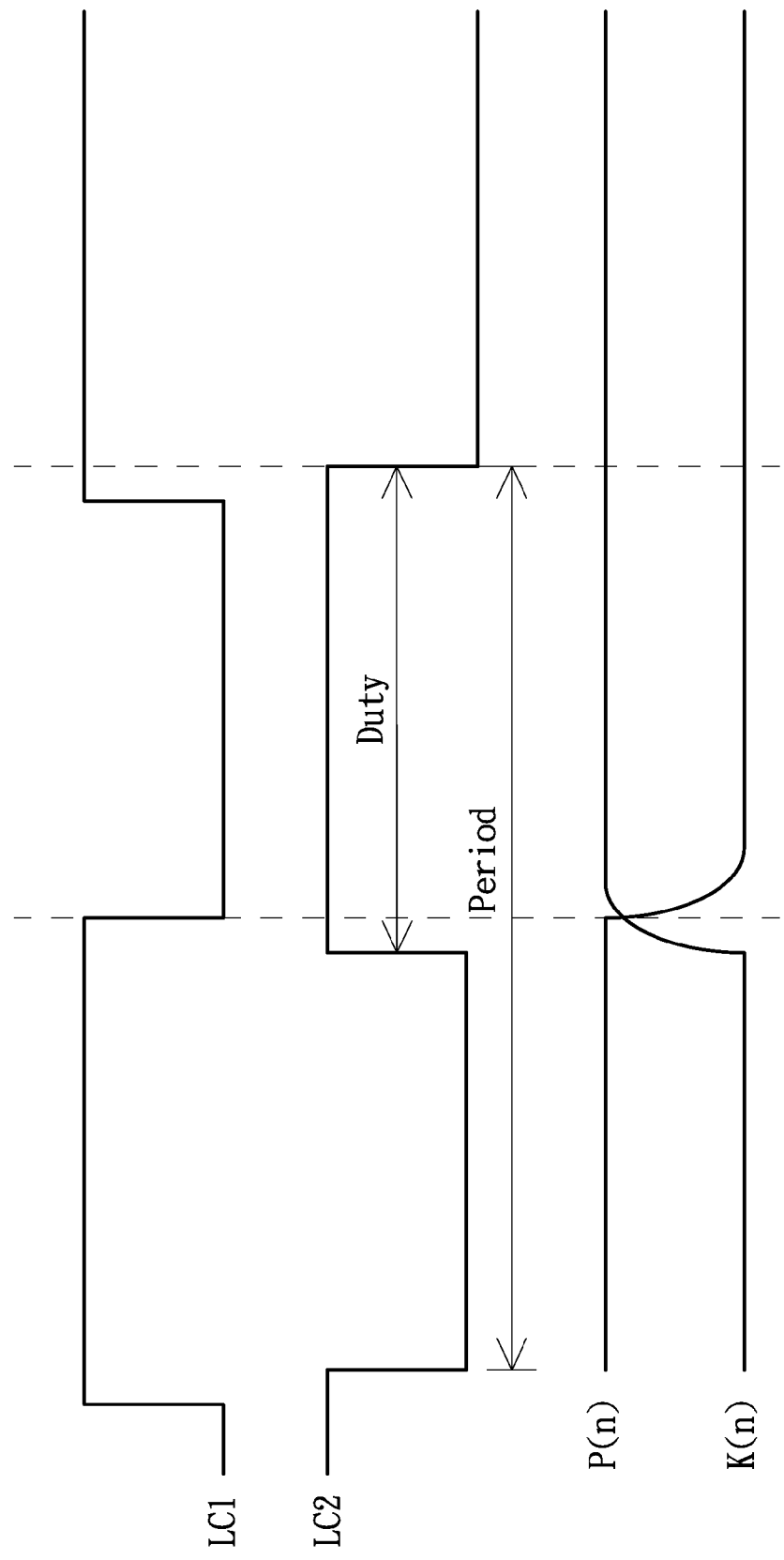
FIG. 3 is a timing diagram of some signals used in the stable modules of the shift register shown in FIG. 1 and FIG. 2.

Referring to FIG. 3, which is a timing diagram of the signals LC1, LC2, P(n), and K(n) used in the first and second stable modules 130, 140 of the shift register 100. As shown in FIGS. 1-3, when the first operation signal LC1 received by the first stable module 130 begins to change from the logic high level thereof to the logic low level thereof, the second operation signal LC2 received by the second stable module 140 has already changed from the logic low level thereof to the logic high level thereof. That is, before the first stable module 130 is disabled, the second stable module 140 has already been enabled. Similarly, when the second operation signal LC2 received by the second stable module 140 begins to change from the logic high level thereof to the logic low level thereof, the first operation signal LC1 received by the first stable module 130 has already changed from the logic low level thereof to the logic high level thereof. That is, before the second stable module 140 is disabled, the first stable module 130 has already been enabled.

In this embodiment, duties of the first operation signal LC1 received by the first stable module 130 and the second operation signal LC2 received by the second stable module 140 are respectively larger than 50% of periods of the first operation signal LC1 and the second operation signal LC2. Furthermore, the operation signal (e.g., LC1/LC2) received by each stable module (e.g., 130/140) can be a low-frequency pulse signal. Preferably, a period of the operation signal (e.g., LC1/LC2) received by each stable module (e.g., 130/140) is between time for displaying 0.1 frames of images and time for displaying 200 frames of images. Of course, it is understandable to ones of ordinary skill in the art, the operation signal (e.g., LC1/LC2) received by each stable module (e.g., 130/140) can also be a pulse signal with a higher frequency.

As shown in FIG. 3, when the first operation signal LC1 received by the first stable module 130 begins to change from the logic high level thereof to the logic low level thereof (i.e., when the first stable module 130 needs to stop working under control of the first operation signal LC), because RC delay may be generated in the circuit of the first stable module 130 and the transistors (i.e., T31, T32, T33, T34, T35, T36) need some time to discharge, potential on the electric connection point P(n) between the transistor T33 and the transistor T34 is still the logic high level thereof at this moment, and needs some time to entirely discharge and become the logic low level thereof. Therefore, due to effect of the logic high level on the electric connection point P(n), the transistor T35 and the transistor T36 keep being in on-states for a predetermined time, such that the first stable module 130 keeps working to stabilize the input signal Q(n) generated by the signal input unit 110 and the first clock signal G(n) generated by the signal output unit 120. Until the potential on the electric connection point P(n) is pulled down to be not high enough to switch the transistor T35 and the transistor T36 on, the first stable module 130 stops working.

Furthermore, before the first operation signal LC1 received by the first stable module 130 changes from the logic high level thereof to the logic low level thereof, the second operation signal LC2 received by the second stable module 140 has already changed from the logic low level thereof to the logic high level thereof. Thus, potential on the electric connection point K(n) of the second stable module 140 has already pulled up by charging. In this way, it can be ensured that before the potential on the electric connection point P(n) is pulled down to be not high enough to switch the transistor T35 and the transistor T36 on by discharging (i.e., before the first stable module 130 stops working), the potential on the electric connection point K(n) of the second stable module 140 has already been pulled up to be high enough to switch the transistor T45 and the transistor T46 on by charging, and thus the second stable module 140 works.

In conclusion, the present invention (e.g., the shift register 100) corrects operation signals (e.g., LC1, LC2) corresponding to the stable modules thereof (e.g., 130, 140) to ensure that one stable module thereof has already been enabled before another stable module thereof is disabled. Thus, the present invention ensures at least one stable module thereof is working when the stable modules thereof are switched, such that stability of the shift register 100 is assured.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register, comprising:
   a signal input unit configured for receiving an input signal and providing the input signal on an output terminal of the signal input unit;
   a signal output unit configured for receiving a clock signal and controlling whether outputting the received clock signal on an output terminal of the signal output unit according to the input signal provided by the signal input unit; and
   a plurality of stable modules, each of the stable modules including a pull-down control circuit and a pull-down circuit; each of the stable modules electrically coupled to the output terminal of the signal input unit, the output terminal of the signal output unit, and a default potential; each of the stable modules receiving a corresponding operation signal and enabled in a duty of the corresponding operation signal, such that both the output terminals of the signal input unit and the signal output unit are electrically coupled to the default potential when the input signal is disabled;
   wherein before one of the stable modules is disabled, another of the stable modules has already been enabled, a Mth raising edge of the Nth operation signal is earlier than a Mth falling edge of the (N−1)th operation signal, and a Mth falling edge of the Nth operation signal is later than a (M+1)th rising edge of the (N−1)th operation signal, M and N are integers.

2. The shift register according to claim 1, wherein amplitudes between each rising edge and each falling edge of the Nth and (N−1)th operation signals are steady in specific voltage level, respectively.

3. The shift register according to claim 1, wherein the stable modules includes a first stable module and a second stable module, the first stable module receives a first operation signal and enabled when the first operation signal is active, the second stable module receives a second operation signal and enabled when the second operation signal is active, the active duration of the first operation signal is greater than the inactive duration of the second operation signal.

4. The shift register according to claim 1, wherein one of the stable modules is enabled before the other one of the stable modules is disabled, so that at least one of the stable modules still works when the stable modules are switched, for assuring the stability of the shift register.

5. The shift register according to claim 1, wherein the number of the stable modules is two, and the duty of the operation signal corresponding to each of the two stable modules is larger than 50% of a period of the operation signal.

6. The shift register according to claim 1, wherein a period of the operation signal corresponding to each of the two stable modules is between time for displaying 0.1 frames of images and time for displaying 200 frames of images.

7. A shift register, comprising:
a signal input unit configured for receiving an input signal and providing the input signal on an output terminal of the signal input unit;
a signal output unit configured for receiving a clock signal and controlling whether outputting the received clock signal on an output terminal of the signal output unit according to the input signal provided by the signal input unit; and
a plurality of stable modules, each of the stable modules including a pull-down control circuit and a pull-down circuit; each of the stable modules electrically coupled to the output terminal of the signal input unit, the output terminal of the signal output unit, and a default potential; each of the stable modules receiving a corresponding operation signal and enabled in a duty of the corresponding operation signal, such that both the output terminals of the signal input unit and the signal output unit are electrically coupled to the default potential when the input signal is disabled;
wherein the number of the stable modules is two, and the duty of the operation signal corresponding to each of the two stable modules is larger than 50% of a period of the operation signal, and the stable modules are not simultaneously inactive.

8. The shift register according to claim 7, wherein a period of the operation signal corresponding to each of the two stable modules is between time for displaying 0.1 frames of images and time for displaying 200 frames of images.

9. The shift register according to claim 7, wherein before one of the stable modules is disabled, another of the stable modules has already been enabled, a Mth raising edge of the Nth operation signal is earlier than a Mth falling edge of the (N−1)th operation signal, and a Mth falling edge of the Nth operation signal is later than a (M+1)th rising edge of the (N−1)th operation signal, M and N are integers.

10. The shift register according to claim 9, wherein amplitudes between each rising edge and each falling edge of the Nth and (N−1)th operation signals are steady in specific voltage level, respectively.

11. The shift register according to claim 7, wherein the stable modules includes a first stable module and a second stable module, the first stable module receives a first operation signal and enabled when the first operation signal is active, the second stable module receives a second operation signal and enabled when the second operation signal is active, the active duration of the first operation signal is greater than the inactive duration of the second operation signal.

12. The shift register according to claim 7, wherein one of the stable modules is enabled before the other one of the stable modules is disabled, so that at least one of the stable modules still works when the stable modules are switched, for assuring the stability of the shift register.

13. A shift register driving method for controlling a potential provided by an output terminal of a shift register, the shift register comprising a signal output unit and a plurality of stable modules, the signal output unit controlling whether outputting a clock signal from the output terminal of the shift register according to an input signal, each of the stable modules including a pull-down control circuit and a pull-down circuit, each of the stable modules electrically coupled to the output terminal of the shift register and a default potential; the shift register driving method comprising:
providing a first operation signal to a first stable module, when the first operation signal is enabled, the first operation signal enabling the output terminal of the shift register to be electrically coupled to the default potential through the first stable module when the input signal is disabled; and
providing a second operation signal to a second stable module, when the second operation signal is enabled, the second operation signal enabling the output terminal of the shift register to be electrically coupled to the default potential through the second stable module when the input signal is disabled;
wherein the second operation signal is enabled before the first operation signal is disabled;
wherein before one of the stable modules is disabled, another of the stable modules has already been enabled, a Mth raising edge of the Nth operation signal is earlier than a Mth falling edge of the (N−1)th operation signal, and a Mth falling edge of the Nth operation signal is later than a (M+1)th rising edge of the (N−1)th operation signal, M and N are integers.

14. The shift register according to claim 13, wherein amplitudes between each rising edge and each falling edge of the Nth and (N−1)th operation signals are steady in specific voltage level, respectively.

15. The shift register according to claim 13, wherein the stable modules includes a first stable module and a second stable module, the first stable module receives a first operation signal and enabled when the first operation signal is active, the second stable module receives a second operation signal and enabled when the second operation signal is active, the active duration of the first operation signal is greater than the inactive duration of the second operation signal.

16. The shift register according to claim 13, wherein one of the stable modules is enabled before the other one of the stable modules is disabled, so that at least one of the stable modules still works when the stable modules are switched, for assuring the stability of the shift register.

17. The shift register according to claim 13, wherein duties of the first operation signal and the second operation signal are respectively larger than 50% of periods of the first operation signal and the second operation signal.

18. The shift register according to claim 13, wherein both periods of the first operation signal and the second operation signal are between time for displaying 0.1 frames of images and time for displaying 200 frames of images.

* * * * *